(12) United States Patent
Komada et al.

(10) Patent No.: US 7,807,491 B2
(45) Date of Patent: Oct. 5, 2010

(54) METHOD OF MANUFACTURING NITRIDE SEMICONDUCTOR LIGHT-EMITTING DEVICE

(75) Inventors: Satoshi Komada, Mihara (JP); Atsushi Ogawa, Mihara (JP); Hiroki Takaoka, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 12/073,393

(22) Filed: Mar. 5, 2008

(65) Prior Publication Data

US 2008/0241983 A1   Oct. 2, 2008

(30) Foreign Application Priority Data

Mar. 27, 2007   (JP) .............................. 2007-081357

(51) Int. Cl.
*H01L 21/00*  (2006.01)
*H01L 21/44*  (2006.01)

(52) U.S. Cl. ...................................... 438/46; 438/681

(58) Field of Classification Search ................... 438/46, 438/681; 257/E33.025
See application file for complete search history.

(56) References Cited

U.S. PATENT DOCUMENTS

| 6,614,059 | B1 | 9/2003 | Tsujimura et al. |
| 2001/0030329 | A1* | 10/2001 | Ueta et al. .................. 257/103 |
| 2006/0175600 | A1* | 8/2006 | Sato et al. ..................... 257/14 |

FOREIGN PATENT DOCUMENTS

| JP | 06-268257 | 9/1994 |
| JP | 09-214052 | 8/1997 |
| JP | 11-126945 | 5/1999 |
| JP | 2000-261106 | 9/2000 |

OTHER PUBLICATIONS

J.P. Liu, et al. "*Effects of TMIn flow on the interface and optical properties of InGaN/GaN mutiple quantum wells*" Journal of Crystal Growth 264 (2004) pp. 53-57.

* cited by examiner

*Primary Examiner*—William M. Brewster
(74) *Attorney, Agent, or Firm*—Harness, Dickey & Pierce, P.L.C.

(57) ABSTRACT

Provided is a method of manufacturing a nitride semiconductor light-emitting device including the step of contacting a surfactant material with the surface of an n-type nitride semiconductor layer or the surface of a p-type nitride semiconductor layer before the growth of an active layer, or, with a grown crystal surface during or after the growth of the active layer. According to this manufacturing method, a nitride semiconductor light-emitting device having higher light-emitting efficiency can be obtained.

9 Claims, 1 Drawing Sheet

METHOD OF MANUFACTURING NITRIDE SEMICONDUCTOR LIGHT-EMITTING DEVICE

This nonprovisional application is based on Japanese Patent Application No. 2007-081357 and filed with the Japan Patent Office on Mar. 27, 2007, the entire contents of which are hereby incorporated by reference.

BACKGROUND OF THE INVENTION

1. Field of the Invention

The present invention relates to a method of manufacturing a nitride semiconductor light-emitting device, and more specifically to a method of manufacturing a nitride semiconductor light-emitting device having an active layer with improved crystal quality and having high light-emitting efficiency.

2. Description of the Background Art

Generally, the active layer of the nitride semiconductor light-emitting device has a multiple quantum well structure in which an $In_{x1}Ga_{1-x1}N$ well layer and an $In_{x2}Ga_{1-x2}N$ barrier layer ($x_1>0$, $x_2\geqq 0$, $x_1>x_2$) having different bandgaps from each other are alternately stacked (for example, Japanese Patent Laying-Open No. 06-268257). The multiple quantum well structure is used to allow a light-emitting layer to be formed with a thin well layer having a thickness of about 2-5 nm while ensuring the state density of the carrier contributing to light emission. Thus, it becomes possible to provide a light-emitting device having higher light-emitting efficiency than in the case where the bulk of the InGaN layer is used as an active layer.

However, in the case where the active layer has a multiple quantum well structure, the well layer and the barrier layer are different in In composition ratio and therefore different in surface energy, which makes it difficult to provide steep interfaces between the well layer and the barrier layer and between the barrier layer and the well layer. In this interface that is not steep, the well layer as a light-emitting layer has a spatially nonuniform thickness. Generally, the quantum efficiency greatly depends on the thickness of the well layer. Accordingly, the well layer having a nonuniform thickness produces a portion having low quantum efficiency, which causes the overall light-emitting efficiency of the light-emitting device to be decreased.

Japanese Patent Laying-Open No. 2000-261106 discloses that Si is doped as an impurity during the crystal growth of the multiple quantum well layer for the purpose of improving the light-emitting efficiency. However, this method poses a problem that the crystal quality deteriorates due to the doping of the impurity during the crystal growth.

Furthermore, Japanese Patent Laying-Open No. 09-214052 discloses that the growth of the AlGaAs active layer is interrupted before or during the growth thereof to add a small amount of indium (In) to the crystal surface. However, in this case, the active layer does not contain In, which causes dispersion and incorporation of In into the crystal, with the result that the device may be affected. In addition, the amount of In to be added must be precisely controlled such that the amount is less than 5 atom percent relative to the Al composition of the active layer, and the supply amount of In is restricted.

SUMMARY OF THE INVENTION

The present invention has been made in light of the above-described problems and aims to provide a manufacturing method with which a nitride semiconductor light-emitting device having higher light-emitting efficiency can be obtained.

The present invention relates to a method of manufacturing a nitride semiconductor light-emitting device having at least an n-type nitride semiconductor layer, an active layer and a p-type nitride semiconductor layer grown on a substrate. The method includes the step of contacting a surfactant material with a surface of the n-type nitride semiconductor layer or a surface of the p-type nitride semiconductor layer before growth of the active layer, or, with a grown crystal surface during or after the growth of the active layer.

In the present invention, the active layer is formed by alternately stacking a well layer and a barrier layer having different bandgaps from each other, and it is preferable to include the step of, after growth of at least one well layer, contacting the surfactant material with the surface of the well layer. It is preferable that the well layer is formed of $In_xGa_{1-x}N$ ($0<x\leqq 1$).

It is preferable that the surfactant material includes In, Al, Ga, Mg, Zn, Si, or Ge.

Furthermore, it is preferable that the n-type nitride semiconductor layer, the active layer and the p-type nitride semiconductor layer are grown by using the metal organic chemical vapor deposition method.

According to the present invention, the light-emitting efficiency of the nitride semiconductor light-emitting device such as a nitride semiconductor light-emitting diode device, for example, emitting blue light can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
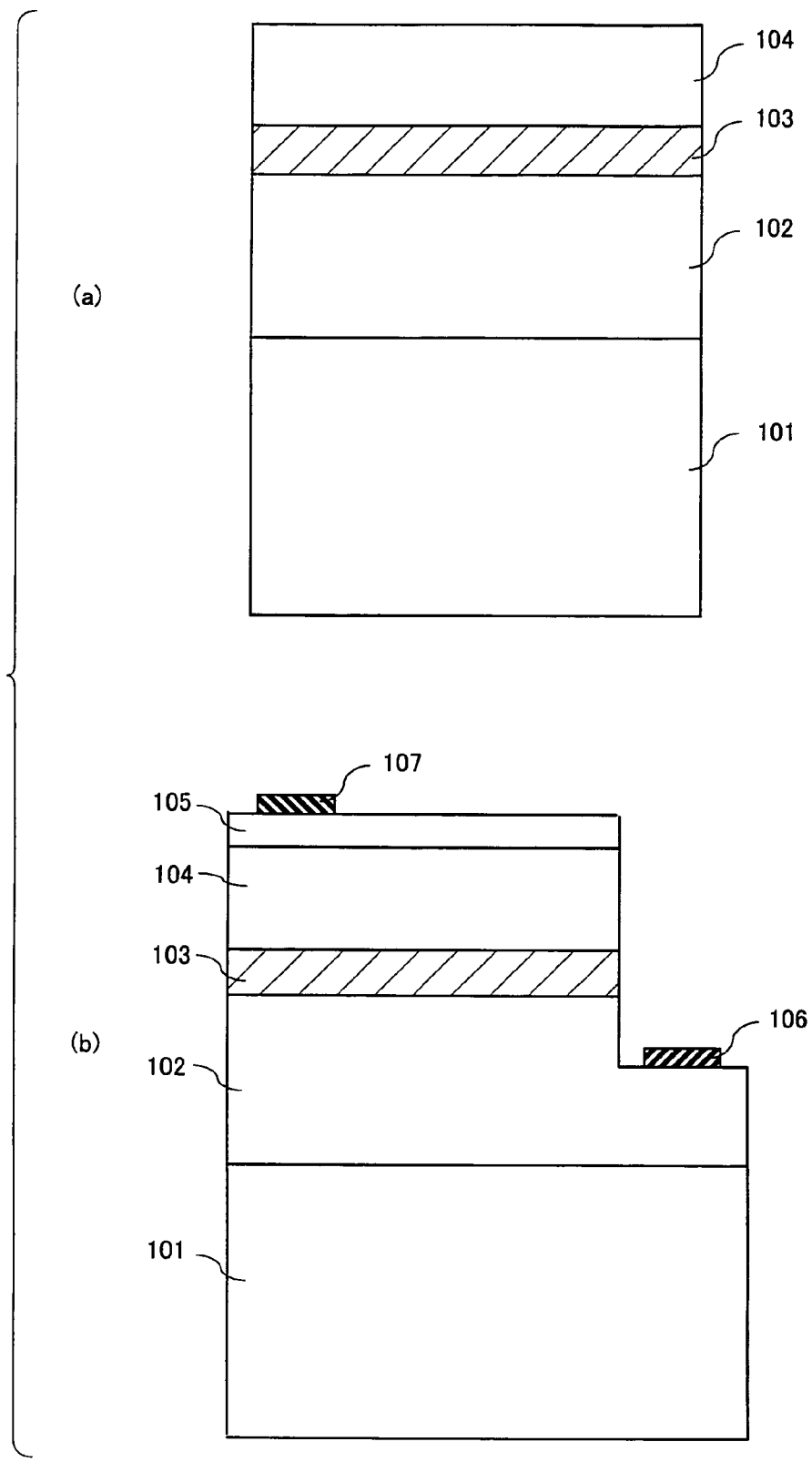
FIG. 1 is a schematic step diagram of a preferred embodiment of the present invention and shows an example of a method of manufacturing a nitride semiconductor light-emitting diode device.

A method of the present invention will be hereinafter described in detail with reference to an embodiment.

In the present embodiment, referring to FIG. 1(a), an n-type nitride semiconductor layer 102 is first formed on a substrate 101 by the metal organic chemical vapor deposition method (MOCVD method). For example, sapphire, SiC, Si, ZnO, and the like can be used as substrate 101. Furthermore, n-type nitride semiconductor layer 102 is formed of $Al_xIn_yGa_{1-x-y}N$ ($0\leqq x\leqq 1$, $0\leqq y\leqq 1$) and includes a GaN buffer layer, an AlN buffer layer, an undoped layer, and the like.

The step of growing an active layer 103 is subsequently performed. Though not shown in FIG. 1, active layer 103 of the present embodiment has a multiple quantum well structure in which a well layer and a barrier layer having different bandgaps from each other are alternately stacked. In order to form the multiple quantum well structure, the well layer is first stacked on n-type nitride semiconductor layer 102 by the metal organic chemical vapor deposition method (MOCVD method) using trimethyl indium (TMI), trimethyl gallium (TMG), and the like as a group III source, and ammonia and the like as a group V source (well layer growth step). The well layer can be formed of $In_xGa_{1-x}N$ ($0<x\leqq 1$).

In the growth interruption step after the growth of the well layer, a surfactant material is brought into contact with the surface of the above-mentioned stacked well layer (surfactant supply step). The well layer growth interruption step refers to the step in which raw material gas as the above-mentioned group III source or raw material gas as the group V source is not supplied. In the growth interruption step after the growth of the well layer, the surfactant material is brought into contact with the surface of the well layer, which causes the energy of the entire system to be reduced in the two-dimensional growth mode (FM mode) as compared to the three-dimensional growth mode (V-W mode) when the barrier layer is formed to cover the well layer. As a result, the steepness and the flatness of the interface between the well layer and the barrier layer can be improved and the well layer having an uniform thickness can be obtained. Consequently, the resultant light-emitting efficiency of the nitride semiconductor light-emitting device is improved. The surfactant supply step will be hereinafter described in detail.

The surfactant material in the present invention is defined as a material which allows the flatness and/or steepness at the hetero interface to be controlled. In particular, it is preferable to use a material which readily changes the growth mode of the nitride semiconductor layer in the vicinity of the hetero interface to the two-dimensional growth mode (FM mode), that is, a material having a low surface energy. More specifically, it is preferable that the surfactant material in the present invention includes a material having a surface energy which is lower than the general surface energy value (about 2.0 J/m$^2$) of GaN mainly used for the nitride semiconductor light-emitting device. This surfactant material may, for example, include an element such as In (surface energy: 0.69 J/m$^2$ (same in the following)), Al (1.16 J/m$^2$), Ga (0.83 J/m$^2$), Mg (0.76 J/m$^2$), Zn (1.02 J/m$^2$), Si (1.29 J/m$^2$), Ge (1.03 J/m$^2$), Sn (0.71 J/m$^2$), Sb (0.68 J/m$^2$), Bi (0.55 J/m$^2$), Rb (0.11 J/m$^2$), Cs (0.09 J/m$^2$), and Na (0.26 J/m$^2$). It is to be noted that the surface energy refers to the total energy of the surface which is determined by the intermolecular force and the surface force and, for example, can be measured by contact angle measurement and the like.

Furthermore, the surfactant material which generally has the property of floating to the contacted surface may be partially incorporated into a crystal, and therefore, is more preferably a group III element commonly used for manufacturing a nitride semiconductor light-emitting device and an n-type or a p-type impurity element. Specifically, the surfactant material of the group III element may include Al, Ga, and In; the surfactant material of the n-type impurity element may include Si and Ge; and the surfactant material of the p-type impurity element may include Zn and Mg.

As specific means for contacting the above-described surfactant material with the crystal surface, though not particularly limited, it is possible to suitably apply the method of performing the metal organic chemical vapor deposition using, as raw material gas, organometallic compound containing an element which is a surfactant material. As raw material gas, trimethyl indium (TMI), triethyl indium; trimethyl aluminum (TMA), triethyl aluminum (TEA); trimethyl gallium (TMG), triethyl gallium; cyclopentadienyl magnesium (Cp$_2$Mg), ethyl-cyclopentadienyl magnesium (EtCp$_2$Mg); dimethyl zinc (DMZn), diethyl zinc (DEZn); silane (SiH$_4$), trimethyl silicon (TMSi), triethyl silicon (TESi); germane (GeH$_4$), tetramethyl germane (TMGe), and the like can be used.

As for the condition of the metal organic chemical vapor deposition in the surfactant supply step, though not particularly limited, it is preferable that the supply partial pressure of TMI is set to not less than 10$^{-3}$ Torr in order to achieve a sufficient effect as a surfactant in the case where In is supplied using, for example, TMI as raw material gas. In the growth interruption step after the growth of the well layer, if the supplied raw material gas and the organometallic compound containing an element which is a surfactant material are the same, the organometallic compound gas does not need to be additionally supplied.

In the present embodiment, for example, if In is used as a surfactant material, the active layer is formed of InGaN and contains In. Accordingly, the balance between the supply amount of In as a surfactant material and the supply amount of In at the time of the growth of the active layer, particularly the well layer, is adjusted, to thereby allow the supply amount of In as a surfactant material to be increased. Furthermore, since the active layer contains In, the crystal and the device are less affected by dispersion of In as a surfactant material into the crystal.

According to the present embodiment, in the growth interruption step of the well layer, that is, in the step in which the raw material gas of the group III source or the raw material gas of the group V source is not supplied, the organometallic compound containing an element which is a surfactant material is supplied. This method has an advantage of less degradation of the crystal quality, as compared to the method of, during the growth of the well layer, contacting the surfactant material with the well layer to dope the surfactant material, that is, the method of supplying the raw material gas of the group III source and the raw material gas of the group V source while further supplying the organometallic compound containing an element which is a surfactant material.

In the subsequent step, a barrier layer is stacked by the metal organic chemical vapor deposition method (MOCVD method) on the surface of the well layer processed by the above-described surfactant material (barrier layer growth step). The barrier layer can be formed of Al$_x$In$_y$Ga$_{1-x-y}$N ($0 \leq x \leq 1$, $0 \leq y \leq 1$). In the present embodiment, the above-described well layer growth step, surfactant supply step and barrier layer growth step are performed six times in total to thereby complete active layer 103 having a multilayer structure.

A p-type nitride semiconductor layer 104 is stacked on the barrier layer which is the top most surface of active layer 103 by the metal organic chemical vapor deposition method (MOCVD method). While p-type nitride semiconductor layer 104 can be formed of Al$_x$In$_y$Ga$_{1-x-y}$N ($0 \leq x \leq 1$, $0 \leq y \leq 1$), it is also preferable to have a multilayer structure in which a cladding layer containing Al and a GaN layer are stacked in this order. Consequently, a light-emitting device structure having n-type nitride semiconductor layer 102, active layer 103 and p-type nitride semiconductor layer 104 sequentially formed on substrate 101 is produced (see FIG. 1(a)).

Finally, the conventionally known method is used to form an electrode and complete a nitride semiconductor light-emitting diode device (FIG. 1(b)). In FIG. 1(b), Pd, Ni, ITO, n-GaN, and the like can be used for a light-transmissive ohmic electrode 105. Au, Ti/Al, and the like are selected for an n-side pad electrode 106 and a p-side pad electrode 107.

In the nitride semiconductor light-emitting diode device of the present embodiment as described above, a surfactant is supplied on the surface of each well layer constituting active layer 103. Therefore, when the surface of the well layer is covered by the barrier layer, the two-dimensional growth mode becomes dominant, which improves the interface steepness and also improves the uniformity of the thickness of each well layer. As a result, the light-emitting efficiency of the light-emitting diode device is greatly improved as compared to the conventional efficiency.

A modification of the above-described embodiment will be hereinafter described. In the above-described embodiment, the surfactant material is supplied in the growth interruption step after the growth of each well layer and before the growth of the barrier layer, but the present invention is not limited thereto. In the growth interruption step after the growth of the barrier layer, the surfactant material may be brought into contact with the surface of the barrier layer to thereafter grow a well layer. The surfactant material may be, of course, supplied to both of the surfaces of the well layer and the barrier layer. Even in the case where the surfactant material is supplied only to the surface of the barrier layer, when the surface of the barrier layer is covered by the well layer, the two-dimensional growth mode becomes dominant. Consequently, the interface steepness is improved, and the light-emitting efficiency is expected to be improved.

Furthermore, the present invention is not limited to the above-described supply of the surfactant material to the interface between the well layer and the barrier layer which constitute an active layer, that is, the supply of the surfactant material to the crystal surface in the growth interruption step in the middle of the growth of the active layer. For example, the surfactant material may be brought into contact with the top most surface of the n-type nitride semiconductor layer in the growth interruption step before growing the active layer, and with the surface of the top most layer of the active layer in the growth interruption step after the growth of the top most layer of the active layer. Even in this case, when the n-type nitride semiconductor layer is covered by the active layer or the active layer is covered by the p-type nitride semiconductor layer, the two-dimensional growth mode becomes dominant, with the result that the steepness at the interface between the n-type nitride semiconductor layer and the active layer or the interface between the p-type nitride semiconductor layer and the active layer is improved, and therefore, the light-emitting efficiency is expected to be improved. However, because of a greater contribution to the uniformity of the thickness of the well layer, it is preferable to supply the surfactant material to the surface of the well layer at least after the growth of the well layer. In the case where the active layer is formed on the p-type nitride semiconductor layer, the surfactant material may be brought into contact with the surface of the p-type semiconductor layer. Or, in the case where the active layer is formed on the undoped nitride semiconductor layer, the surfactant material may be brought into contact with the surface of the undoped semiconductor layer.

Furthermore, in the active layer having a multiple quantum well structure in which the well layer and the barrier layer are alternately stacked, the layer having contact with the n-type nitride semiconductor layer may be a well layer or a barrier layer, and the layer having contact with the p-type nitride semiconductor layer may also be a well layer or a barrier layer. The number of stacks of the well layer and the barrier layer in the multiple quantum well structure is also not limited to the above and selected as appropriate.

In addition, the configuration of the electrode is not limited to a structure having two electrodes mounted on one side as shown in FIG. 1(b), but may include, for example, a structure having an electrode mounted on each of the upper and lower sides, in which p-type nitride semiconductor layer 104 is attached to a conductive support substrate additionally provided, substrate 101 is removed, an electrode is then formed on the surface of n-type nitride semiconductor layer 102 on the side from which light is extracted, and a metal layer made of Al, Pt, Ag, and the like and having high reflectance is formed between the above-mentioned support substrate and p-type nitride semiconductor layer 104.

The present invention will be hereinafter described in detail with reference to an example and a comparative example, but is not limited thereto.

EXAMPLES

Example 1

A nitride semiconductor light-emitting diode device having a structure shown in FIG. 1(b) was produced by the method as described below. A substrate 101 made of sapphire was first prepared and placed in the reactor of an MOCVD apparatus. While feeding hydrogen into the reactor, the temperature of substrate 101 was raised to 1050° C. to clean the surface (a surface C) of substrate 101. The temperature of substrate 101 was then lowered to 510° C. Hydrogen as carrier gas, and ammonia and TMG (trimethyl gallium) as raw material gas were fed into the reactor to stack a buffer layer formed of GaN and having a thickness of about 20 nm on the surface (surface C) of substrate 101 by the MOCVD method. The temperature of substrate 101 was then raised to 1050° C. Hydrogen as carrier gas, ammonia and TMG as raw material gas, and silane as impurity gas were fed into the reactor to stack an n-type nitride semiconductor underlayer formed of GaN which was doped with Si (carrier concentration: $1\times10^{18}$/cm$^3$) and having a thickness of 6 μm on the buffer layer by the MOCVD method. Then, as with the n-type nitride semiconductor underlayer except that Si was doped so as to achieve a carrier concentration of $5\times10^{18}$/cm$^3$, an n-type nitride semiconductor contact layer formed of GaN and having a thickness of 0.5 μm was stacked on the n-type nitride semiconductor underlayer by the MOCVD method, to form an n-type nitride semiconductor layer 102 consisting of the buffer layer, the n-type nitride semiconductor underlayer and the n-type nitride semiconductor contact layer.

The temperature of substrate 101 was lowered to 700° C. Nitrogen as carrier gas, and ammonia, TMG and TMI (trimethyl indium) as raw material gas were then fed into the reactor, to grow an In$_{0.15}$Ga$_{0.75}$N well layer having a thickness of 2.5 nm on the n-type nitride semiconductor contact layer (well layer growth step). Subsequently, the temperature of substrate 101 was maintained at 700° C. Nitrogen as carrier gas and only TMI as raw material gas were then fed into the reactor to supply In (indium) as a surfactant to the surface of the In$_{0.15}$Ga$_{0.75}$N well layer (surfactant supply step). As a barrier layer growth step, the temperature of substrate 101 was maintained at 700° C. Then, nitrogen as carrier gas, and ammonia and TMG as raw material gas were fed into the reactor, to stack a GaN barrier layer having a thickness of 18 nm. A set of the well layer growth step, the surfactant supply step and the barrier layer growth step was performed six times in total to form an active layer 103.

The temperature of substrate 101 was raised to 950° C. Hydrogen as carrier gas, ammonia, TMG and TMA (trimethyl aluminum) as raw material gas, and CP$_2$Mg (cyclopentadienyl magnesium) as impurity gas were then fed into the reactor, to stack a p-type nitride semiconductor cladding layer formed of Al$_{0.15}$Ga$_{0.85}$N which was doped with Mg in the concentration of $1\times10^{20}$/cm$^3$ and having a thickness of about 30 nm on active layer 103 by the MOCVD method. Subsequently, the temperature of substrate 101 was maintained at 950° C. Hydrogen as carrier gas, ammonia and TMG as raw material gas, and CP$_2$Mg as impurity gas were then fed into the reactor, to stack a p-type nitride semiconductor contact layer formed of GaN which was doped with Mg in the concentration of $1\times 10^{20}/cm^3$ and having a thickness of 0.1 μm on the p-type nitride semiconductor cladding layer by the MOCVD method, and to form a p-type nitride semiconductor layer 104 consisting of the p-type nitride semiconductor cladding layer and the p-type nitride semiconductor contact layer.

The temperature of substrate 101 was lowered to 700° C. Nitrogen as carrier gas was then fed into the reactor to perform annealing, and subsequently, the wafer was removed from the reactor to form a mask patterned in the predetermined shape on the surface of p-type nitride semiconductor layer 104 which was the top most layer. Then, etching was performed with an RIE (reactive ion etching) apparatus from the p-type nitride semiconductor layer 104 side to expose the surface of the n-type nitride semiconductor contact layer. After the etching, on almost the entire surface of p-type nitride semiconductor layer 104 which was the top most layer, a light-transmissive ohmic electrode 105 containing Pd and having a thickness of 7 nm was formed, on which a p-side pad electrode 107 made of Au and having a coating thickness of 0.5 μm was formed at the predetermined position. Furthermore, an n-side pad electrode 106 containing Ti and Al was formed on the surface of n-type nitride semiconductor contact layer exposed by the etching, to complete a nitride semiconductor light-emitting diode device.

Examples 2-7

A nitride semiconductor light-emitting diode device was completed in the manner similar to Example 1 except that Al, Ga, Si, Ge, Mg, and Zn were respectively used as a surfactant material (Examples 2-7). As raw material gas, TMA, TMG, $SiH_4$, TMGe, $CP_2Mg$, and DMZn were used, respectively.

Example 8

In the surfactant supply step, a nitride semiconductor light-emitting diode device was completed in the manner similar to Example 1 except that $NH_3$ gas was supplied together with nitrogen as carrier gas and TMI as raw material gas.

Examples 9-14

The surfactant supply step was performed after the growth of the barrier layer. In other words, a nitride semiconductor light-emitting diode device was completed in the manner similar to Examples 2-7 except that the surfactant material was brought into contact with the surface of the barrier layer (Examples 9-14). The same raw material gas was used as in Examples 2-7. Furthermore, $NH_3$ was not supplied.

Examples 15-20

The surfactant supply step was performed after the growth of n-type nitride semiconductor layer 102. In other words, a nitride semiconductor light-emitting diode device was completed in the manner similar to Examples 9-14 except that the surfactant material was brought into contact with the surface of n-type nitride semiconductor layer 102 (Examples 15-20).

Comparative Example 1

A nitride semiconductor light-emitting diode device was produced in the manner similar to Example 1 except that the above-described surfactant supply step was not performed.

The light-emitting efficiency of the resultant nitride semiconductor light-emitting diode device in each of Examples 1-20 can be improved as compared to Comparative Example 1.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a nitride semiconductor light-emitting device, comprising:
   growing an n-type nitride semiconductor layer, an active layer, and a p-type nitride semiconductor layer on a substrate, said active layer grown by alternately stacking at least one well layer and at least one barrier layer having different bandgaps, the stacking of the well layer and barrier layer including:
   a well layer growth step of forming the well layer;
   a growth interruption step of interrupting growth of the active layer by halting a supply of raw material gas for forming the well layer; and
   a barrier layer growth step of forming the barrier layer,
   wherein a surfactant material for controlling a steepness and flatness of an interface between the well layer and the barrier layer is brought in contact with a surface of the well layer during the growth interruption step.

2. The method of manufacturing the nitride semiconductor light-emitting device according to claim 1, wherein said surfactant material includes In, Al, Ga, Mg, Zn, Si, or Ge.

3. The method of manufacturing the nitride semiconductor light-emitting device according to claim 1, wherein said well layer is formed of $In_xGa_{1-x}N$ ($0<x\leq 1$).

4. The method of manufacturing the nitride semiconductor light-emitting device according to claim 1, wherein said n-type nitride semiconductor layer, said active layer, and said p-type nitride semiconductor layer are grown by using a metal organic chemical vapor deposition method.

5. The method of manufacturing the nitride semiconductor light-emitting device according to claim 1, wherein said active layer is grown at a temperature of about 700° C.

6. The method of manufacturing the nitride semiconductor light-emitting device according to claim 1, wherein said barrier layer is a GaN layer.

7. The method of manufacturing the nitride semiconductor light-emitting device according to claim 1, wherein said surfactant material facilitates a two-dimensional growth mode (FM mode) as opposed to a three-dimensional growth mode (V-W mode).

8. The method of manufacturing the nitride semiconductor light-emitting device according to claim 1, wherein said surfactant material has a surface energy that is lower than that of GaN.

9. The method of manufacturing the nitride semiconductor light-emitting device according to claim 1, wherein said surfactant material has a surface energy that is lower than about 2.0 $J/m^2$.

* * * * *